(12) United States Patent
Sheng-Hsiung et al.

(10) Patent No.: US 6,515,867 B2
(45) Date of Patent: Feb. 4, 2003

(54) SCREW-LESS FIXING STRUCTURE

(75) Inventors: Cheng Sheng-Hsiung, Taipei Hsien (TW); Peng Kang-Chih, Taipei Hsien (TW)

(73) Assignee: Aopen Inc. (TW)

( * ) Notice: Subject to any disclaimer, the term of this patent is extended or adjusted under 35 U.S.C. 154(b) by 0 days.

(21) Appl. No.: 10/012,488

(22) Filed: Dec. 12, 2001

(65) Prior Publication Data
US 2003/0007336 A1 Jan. 9, 2003

(30) Foreign Application Priority Data
Jul. 4, 2001 (CN) .......................... 90116413 A

(51) Int. Cl.$^7$ .......................... H05K 5/00; H05K 5/04; H05K 5/06
(52) U.S. Cl. .................. 361/759; 361/796; 361/798; 361/801; 361/802; 361/756; 361/752; 361/753; 211/41.17; 220/4.02; 248/200; 248/222.52; 248/223.31; 248/225.11; 248/225.21
(58) Field of Search ................ 361/759, 798, 361/796, 801, 802, 752, 753, 756

(56) References Cited
U.S. PATENT DOCUMENTS 5,694,291 A * 12/1997 Feightner .................... 361/683
5,757,618 A * 5/1998 Lee .............................. 361/686
5,982,627 A * 11/1999 Haughton et al. .......... 206/706
6,320,760 B1 * 11/2001 Flamm et al. ............. 211/41.17

* cited by examiner

*Primary Examiner*—David Martin
*Assistant Examiner*—Thanh Yen Tran
(74) *Attorney, Agent, or Firm*—Michael D. Bednarek; Shaw Pittman LLP

(57) ABSTRACT

A screw-less fixing structure is provided for users to mount the add-on card onto a PC. The screw-less fixing structure comprises a support plate, a rotational pressing plate, a positioning device, and a spring wire. When a user attempts to replace an old add-on card with a new one, he needs only to release the screw-less fixing structure by grasping and pulling the handling portion of the spring wire, replace the old add in card with the new one, and finally tighten the screw-less fixing structure by grasping and pushing the spring wire to reach the tightening state. In the above procedures for replacing the add-on card, the user does not need any additional tool nor screw so that the present invention has the advantages of safe, fast, easy and convenient to use.

12 Claims, 7 Drawing Sheets

SCREW-LESS FIXING STRUCTURE

REFERENCE TO RELATED APPLICATION

The present application claims priority to Taiwan application no. 090116413, entitled "Screw-less Fixing Structure," filed on Jul. 4, 2001.

BACKGROUND OF THE INVENTION

1. Field of the Invention

The present invention relates to a screw-less fixing structure, and more particularly, to a screw-less fixing structure for mounting the add-on card onto a Personal Computer without using screw and screwdriver.

2. Description of the Prior Art

Personal computer has become more and more popular, and is no longer an advanced technical tool for the professional persons to rely on for solving highly sophisticated problems. Also, when the user learn more about using the PC, he will learn more about the hardware of the PC as well. Therefore, the user's behavior has been changed from the conventional type of simply buying and using a PC to the modern type of buying the hardware parts and assembling a PC of his own. In addition, in the fast growing computer industry, new hardware is developed and marketed at a rapid speed, and it is often necessary to upgrade the "old" PC to a more advanced level. Such being the circumstances, it may be preferable for a user to upgrade his PC by himself since this is cheaper and easier than buying a new PC.

Accordingly, a PC is required to be easily assembled/disassembled so as to facilitate a user to upgrade his PC by himself. Among all of the hardware of a PC, add-on cards, such as the display card, the video card and the network card, are the most common ones to be upgraded. According to the prior art, a method of upgrading the add-on card is described as follows.

Please refer to FIG. 1, which is a perspective view showing a conventional arrangement of an add-on card in a PC. Typically, a PC has a slot fixing module 101 disposed on the inner side of a back plate of the PC. The slot fixing module 101 has a plurality of fixing slots 102 (usually seven slots) for fixing the add-on card 110. It can be seen that there is a bracket 111 disposed on one end of the add-on card 110, and a fixing sheet 112 is bent outward to form at one end of the bracket 111 for attaching to the fixing plane 104 of the slot fixing module 101. For assembling the add-on card 110 onto the PC, users have to insert the add-on card 110 into the slot (not shown) on the motherboard. At the same time, the bracket 111 covers the fixing slot 102, and the connect portion (not shown) of the add-on card 110 can be exposed to connect with the peripherals such as a display unit, a speaker, or the like. There is a screw hole 103 formed on the fixing plane 104, and correspondingly there is a U-shape portion formed in the fixing sheet 112 so that the screw hole 103 can mate with the U-shape portion when the fixing sheet 112 attaches to the fixing plane 104. Accordingly, the users can apply a screwdriver and use a screw to fasten the add-on card 110 to the slot fixing module 101.

According to the above description, an add-on card can be successfully mounted to the slot fixing module; however, a screwdriver and a screw are required for the assembly and disassembly of an add-on card. It is also very inconvenient to mount the add-on card in such a manner, particularly the screw is so tiny and may be easily lost, and the user's hand may be slashed if he is not a skilled person. All of these disadvantages show that the prior art is not user-friendly and cause difficulties when upgrading the add-on card.

SUMMARY OF THE INVENTION

It is therefore a primary object of the present invention to provide a screw-less fixing structure for fixing the add-on card onto a PC that is more convenient and user-friendly.

A PC includes a back plate and a slot fixing module. The slot fixing module (it is a standard specification specified by INTEL), which is installed inside the PC, has a fixing plane and a plurality of slots for fixing the add-on card. The add-on card includes a bracket, and one end of the bracket is bent to form a fixing sheet. For fixing the add-on card, the fixing sheet is attached to the fixing plane, and the bracket is covered on the slot.

The screw-less fixing structure comprises a support plate, a rotational pressing plate, a positioning device, and a spring wire. The support plate is fixed on the back plate and has two pivot seats at two opposed edges The rotational pressing plate is pressed on the fixing plane against the add-on card. The rotational pressing plate has two protrusion pivots and the arched bearing. The two protrusion pivots of the rotational pressing plate are pivotally coupled to the two pivot seats of the support plate, so that the rotational pressing plate can pivot relative to the support plate for switching between the releasing state and the tightening state. The spring wire has a first hook pivot formed at one end and a second hook pivot formed at the other end. The two hook pivots of the spring wire pivotally couples to the arched bearing of the rotational pressing plate such that the spring wire can pivot relative to the rotational pressing plate and can be coupled to the positioning device for fastening the rotational pressing plate in the tightening state.

When a user attempts to replace an old add-on card with a new one, he needs only to release the screw-less fixing structure by grasping and pulling the handling portion of the spring wire, replace the old add-on card with the new one, and finally tighten the screw-less fixing structure by grasping and pushing the spring wire to reach the tightening state. In the above procedures for replacing the add-on card, the user does not need any additional tool nor screw so that the present invention has the advantages of safe, fast, easy and convenient to use.

These and other attributes of the present invention will become more clear upon a thorough study of the following description of the preferred embodiments for carrying out the invention, particularly when reviewed in conjunction with the drawings.

DETAILED DESCRIPTION OF THE PREFERRED EMBODIMENT

Figure 1:
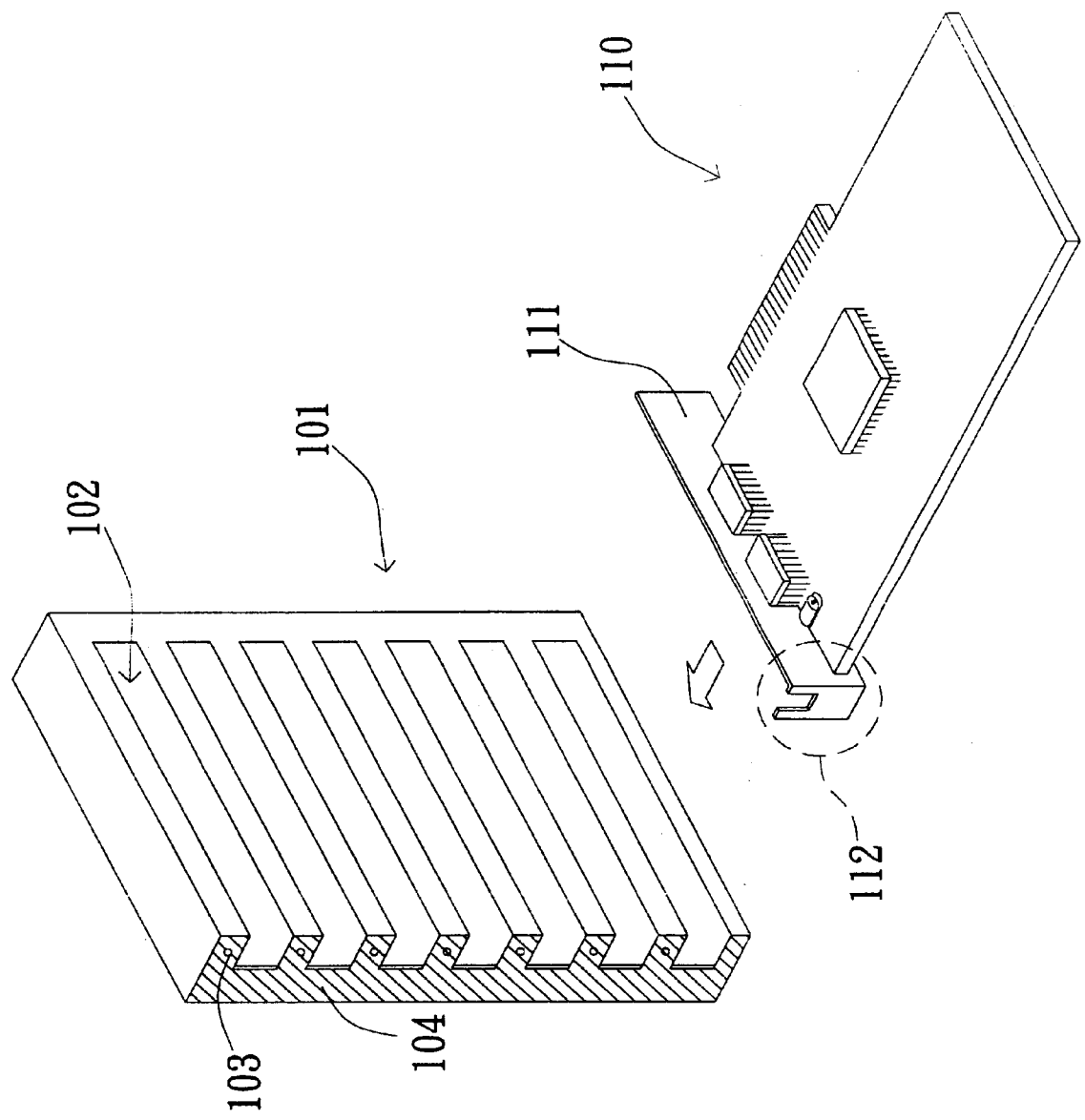
FIG. 1 is a perspective view showing the conventional arrangement of the add-on card in a PC.
Figure 2:
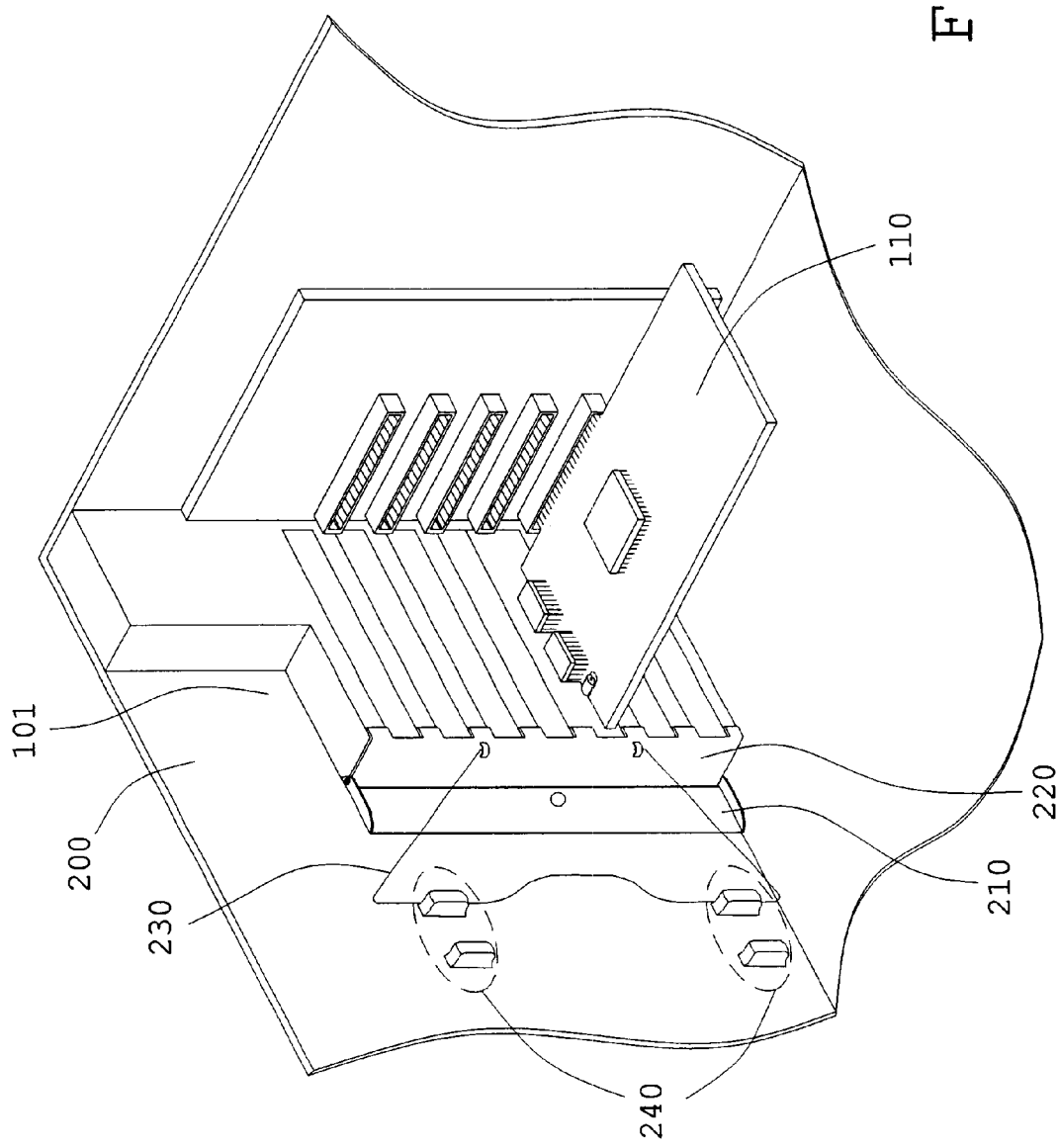
FIG. 2 is a preferred embodiment showing the arrangement of the screw-less fixing structure in a PC according to the present invention.

Please refer to FIG. 2. FIG. 2 is a preferred embodiment showing the arrangement of the screw-less fixing structure in a PC according to the present invention. The screw-less fixing structure comprises a support plate 210, a rotational pressing plate 220, a spring wire 230, and two sets of positioning device 240. The support plate 210 is fixed on the inner side of a back plate 200 and couples with the rotational pressing plate 220 such that the rotational pressing plate 220 can pivot with respect to the support plate 210. For fixing the add-on card in a tightening state, the rotational pressing plate 220 is rotated to a position as shown in the drawing, attached to the fixing plane 104, and pressed against the fixing sheet 112 for fastening the add-on card 110. In such a tightening state, the fixing sheet 112 is sandwiched between the rotational pressing plate 220 and the fixing plane 104; therefore, the fixing sheet 112 is not shown in the drawing. On the other hand, the spring wire 230, which is pivotally installed on the rotational pressing plate 220, can pivot with respect to the rotational pressing plate 220. After the rotational pressing plate 220 has been pressed against the fixing sheet 112, the users need only to rotate the spring wire 230 to a proper position and couple it to the positioning device 240; consequently, the rotational pressing plate 220 stably presses against the fixing sheet 112 and the fixing plane 104 to fasten the add-on card 110. According to the foregoing description, the users no more need a screwdriver or screw for fixing the add-on card 110 onto the PC, and all they have to do is to rotate the spring wire 230 and then couple it to the positioning device 240.

Figure 3A:
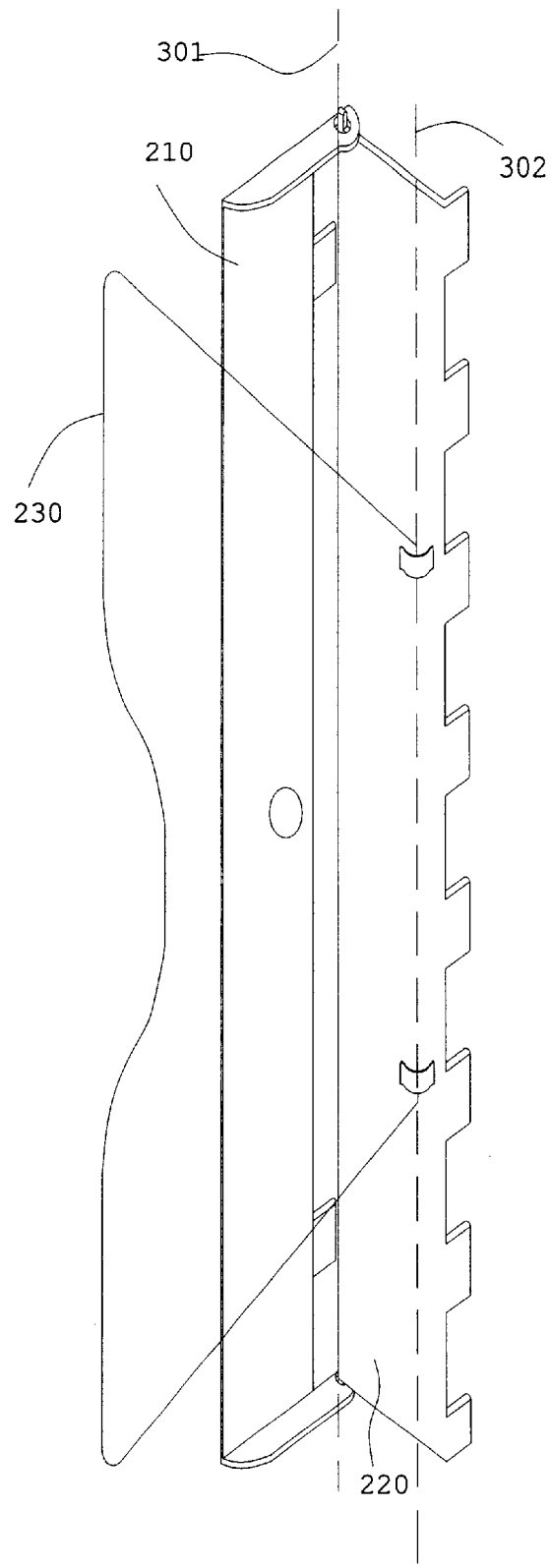
FIG. 3A is a perspective view showing the assembly of support plate, the rotational pressing plate, and the spring wire as shown in FIG. 2.

Please refer to FIG. 3A. FIG. 3A is a perspective view showing the assembly of the support plate 210, the rotational pressing plate 220, and the spring wire 230 as shown in the FIG. 2. As shown in the drawing, after the support plate 210 has been coupled with the rotational pressing plate 220, the rotational pressing plate 220 can pivot about an axial line 301 relative to the support plate 210. Similarly, after rotational pressing plate 220 has been coupled with the spring wire 230, the spring wire 230 can pivot about an axial line 302 relative to the rotational pressing plate 220. The axial lines 301 and 302 are straight lines and parallel to each other, while the axial line 301 is fixed as shown in the drawing, and the axial line 302 is traveled to follow the movement of the rotational pressing plate 220. In order to illustrate the constitution and the operation of the screw-less fixing structure, the components of the screw-less fixing structure are described in a more detailed manner as follows.

Figure 3B:
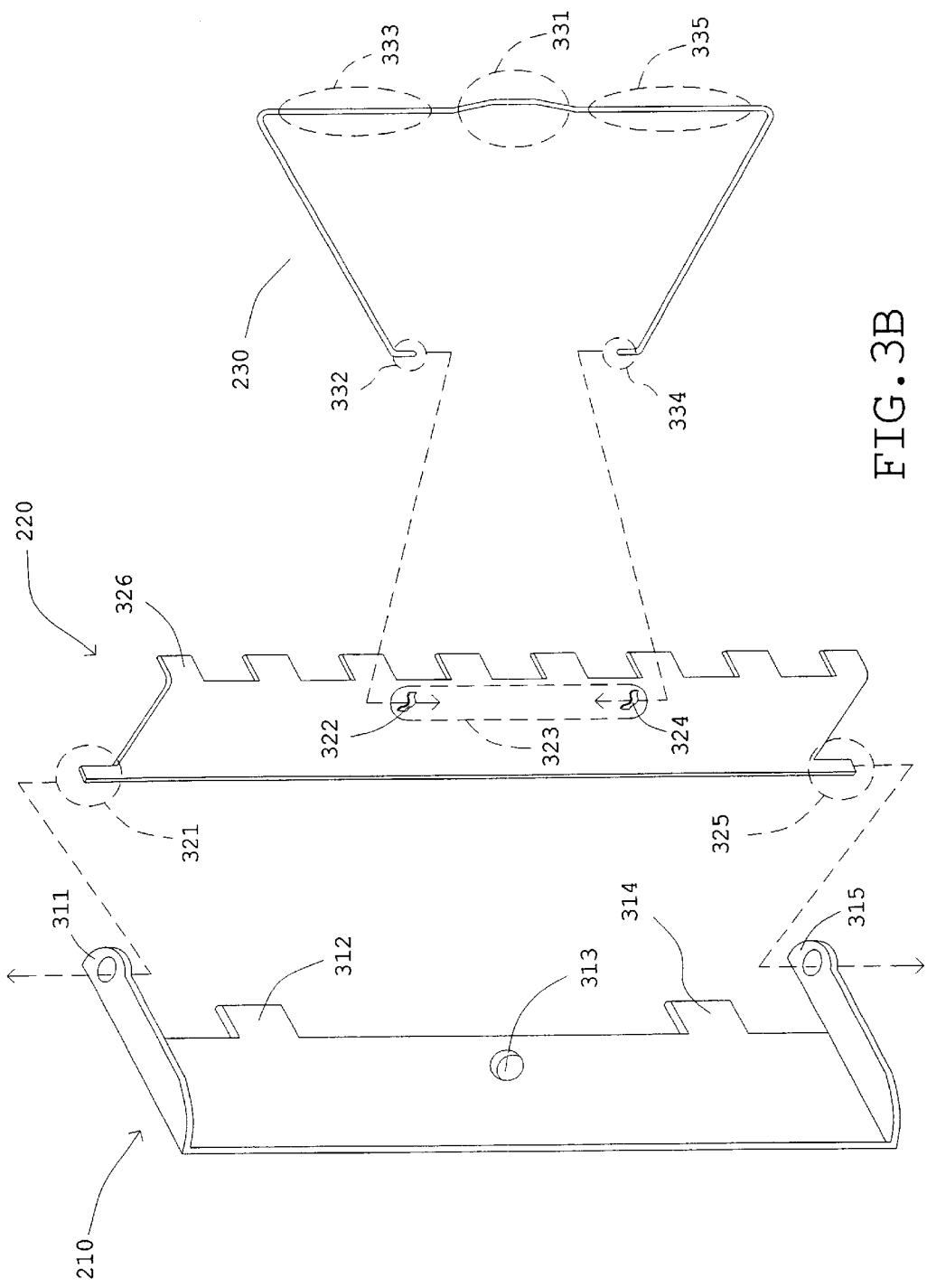
FIG. 3B is a partial exploded view of the assembly shown in FIG. 3A.

Please refer to FIG. 3B. FIG. 3B is a partial exploded view of the assembly of the support plate 210, the rotational pressing plate 220, and the spring wire 230 as shown in FIG. 3A. Two inserting extrusions 312 and 314 are provided on one edge of the support plate 210, and a screw hole 313 is located at the middle of the support plate 210. By means of the inserting extrusions 312,314 and the screw hole 313, the support plate 210 is fixed on the back plate 200. The support plate 210 further comprises two pivot seats 311 and 315 formed separately on two opposed edges. The rotational pressing plate 220 has two protrusion pivots 321, 325 which protruded separately from two opposed edges thereof so as to be respectively received in the two pivot seats 311, 315. By inserting respectively the two protrusion pivots 321, 325 through the two corresponding pivot seats 311, 315, the rotational pressing plate 220 is coupled to, and pivots relative to, the support plate 210. Furthermore, the rotational pressing plate 220 has a plurality of grasping portion 326, for example, eight portions as shown in the drawings. After the rotational pressing plate 220 has joined to the slot fixing module 101, each of the grasping portion 326 presses against the slot fixing module 101. The grasping portions 326 may be alternatively formed as a strip without departing, from the spirit of the present invention. In addition, the rotational pressing plate 220 comprises the arched bearing 323 which includes two arched sheets 322,324 so as to respectively receive the hook pivots 332,334 of the spring wire 230. The spring wire 230 is an elastic steel wire and formed as shown in the drawing. The spring wire 230 has a hook pivot 332 bent to form at one end and a hook pivot 334 bent to form at the other end. The hook pivots 332, 334 are received in the arched sheets 322, 324, respectively, such that the spring wire 230 can pivot with respect to the rotational pressing plate 220 and couple to the positioning device 240 in a tightening state. The spring wire 230 comprises a handling portion 331 formed as a bow at the middle portion, and two positioning portions 333, 335 beside the handling portion 331 for coupling to the positioning device 240.

Figure 4:
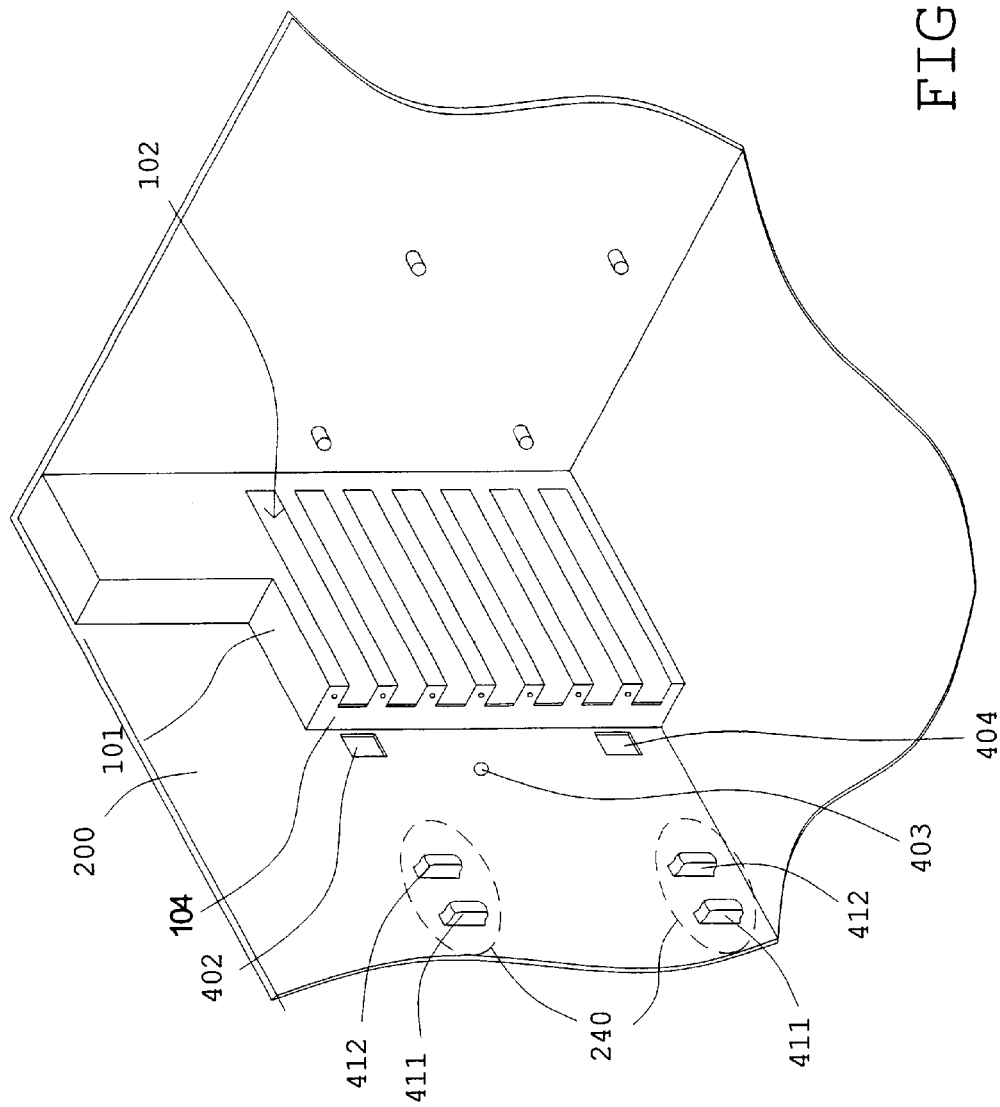
FIG. 4 is a schematic view showing the arrangement of the back plate shown in FIG. 2.

Please refer to FIG. 4. FIG. 4 is a schematic view showing the arrangement of the backs plate 200 shown in FIG. 2. The back plate 200 comprises a screw hole 403 and two through holes 402, 404, and the positioning device 240 on the inner side. The positioning device 240 comprise a first pair of projecting studs 411 and a second pair of projecting studs 412 for coupling to the spring wire 230. The screw hole 403 corresponds to the screw hole 313 of the support plate 210, the through hole 402 corresponds to the inserting extrusion 312, and the through hole 404 corresponds to the inserting extrusion 314. In order to fix the support plate 210 onto the back plate 200, the inserting extrusion 312 is coupled to the through hole 402, the inserting extrusion 314 is coupled to the through hole 404, and the screw hole 403 and the screw hole 313 are screwed together by a screw such that the support plate 210 can be fixed on the back plate 200.

Figures 5A, 5B:
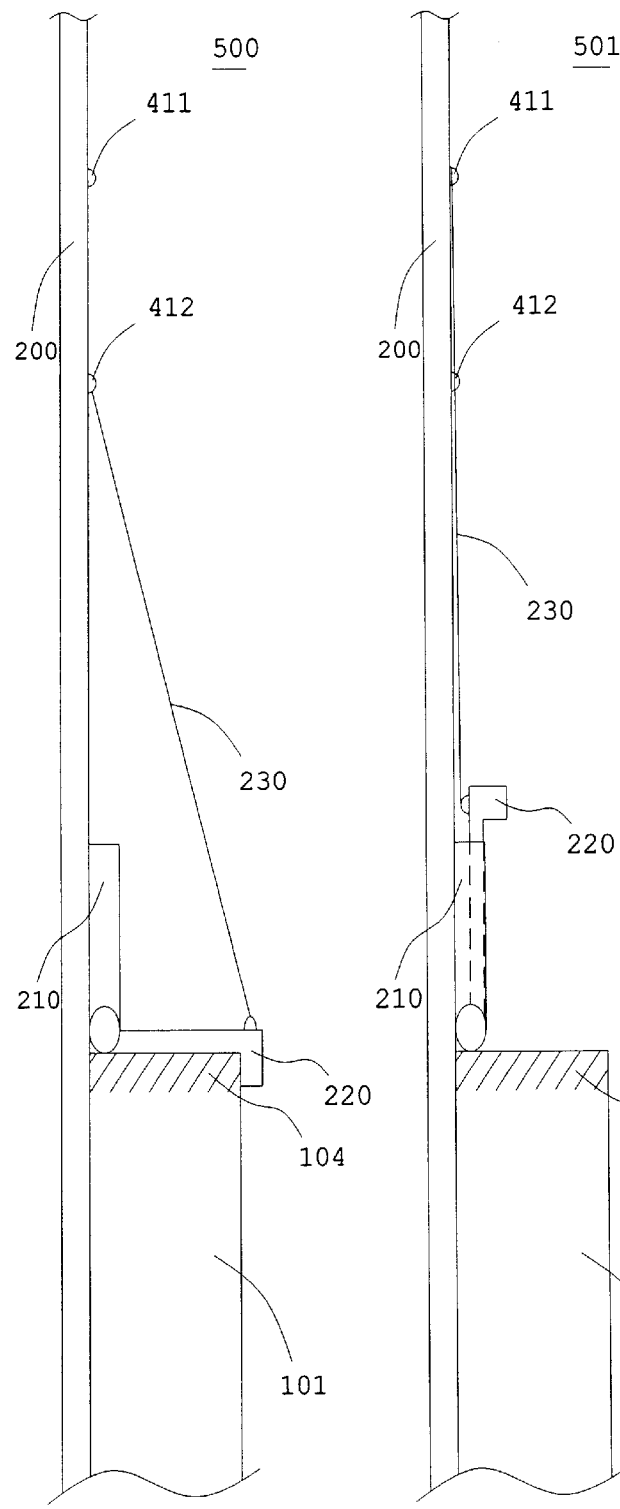
FIG. 5A is a side view showing that the screw-less fixing structure attaches to the slot fixing module in a tightening state according to the present invention.
FIG. 5B is a side view showing that the screw-less fixing structure separates from the slot fixing module in a releasing state according to the present invention.

Please refer to FIG. 5A. FIG. 5A is a side view showing that the screw-less fixing structure attaches to the slot fixing module 101 in a tightening state according to the present invention. When the screw-less fixing structure 101 is in the tightening state 500, the rotational pressing plate 220 attaches to the fixing plane 104 so as to fasten the add-on card 110. At the same time, the spring wire 230 is rotated to a proper position such that the positioning portion 333,335 couple to the second pair of projecting studs 412. For disassembling the add-on card 110, the user can grasp the handling portion 331 and pull the spring wire 230 for releasing and rotating the rotational pressing plate 220 so that the rotational pressing plate 220 comes to the releasing state 501. Please refer to the FIG. 5B. FIG. 5B a side view showing that the screw-less fixing structure separates from the slot fixing module 101 in a releasing state 501 according to the present invention. A when the screw-less fixing structure Is in the releasing state 501, the rotational pressing plate 220 is rotated to a position as shown in the drawing. At the same time, the spring wire 230 is rotated to another proper position such that the positioning portions 333,335 couple to the first pair of projecting studs 411. After the old add-on card is replaced by a new one, the user then grasps the handling portion 331 and pushes the spring wire 230 for rotating the rotational pressing plate 220 to the proper position so that the rotational pressing plate 220 comes to the tightening state 500.

Figure 6A:
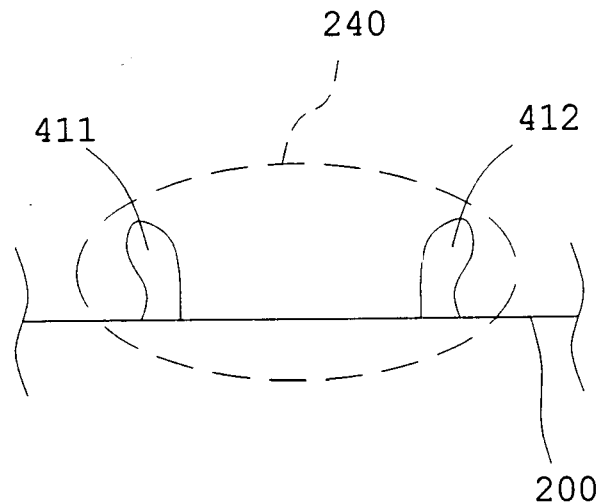
FIG. 6A is a schematic view showing one design of the positioning device of the preferred embodiment according to the present invention.
Figure 6B:
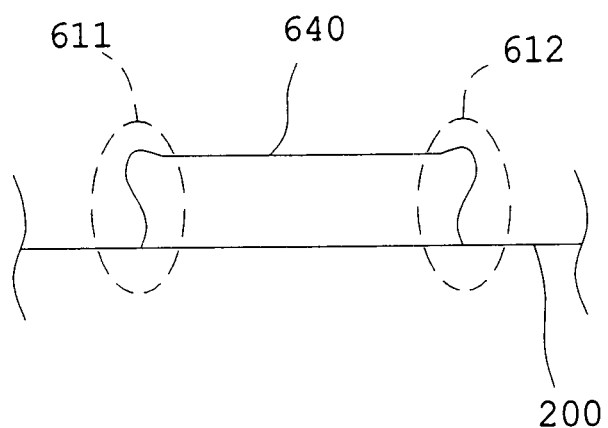
FIG. 6B is a schematic view showing another design of the positioning device of the preferred embodiment according to the present invention.

In order to facilitate the coupling of the positioning device 240 and the positioning portions 333,335, the positioning device 240 is designed into a special form. Please refer to FIG. 6A. FIG. 6A is a schematic view showing one design of the positioning device of the preferred embodiment according to the present invention. The positioning device 240 comprises a first pair of projecting studs 411 and a second pair of projecting studs 412, both projects from the inner surface of the back plate 200. More particularly, the studs 411,412 are provided with protruding portions so that the positioning portion 333,335 of the spring wire 230 can be easily coupled thereto. Alternatively, the positioning device 240 can also be designed as a strip stopper 640 as shown in the FIG. 6B. FIG. 6B is a schematic view showing another design of the positioning device of the preferred embodiment according to the present invention. The strip stopper 640 has a releasing end 611 and a tightening end 612. the releasing end 611 and the tightening end 612 are also provided with protruding portions so that the positioning portion 333,335 of the spring wire 230 can be easily coupled thereto.

According to the above detailed description of the present invention, when a user attempts to assemble/disassemble an add-on card, he does not need to use screw nor screwdriver. Therefore, the present invention provides a simple structure and prevents the user from preparing any tool or screw which may be easily lost.

In contrast to the prior art, the present invention possesses the following advantages:

(a). Without using any tool, the assembly/disassembly of an add-on card can be performed easily.

(b). For assembling/disassembling an add-on card, the users no more need the screw, which is tiny and may be easily lost.

(c). The screw-less fixing structure is simple in its structure and is easy to be used; users can assemble it by themselves without changing the original structure of the PC. Moreover, the screw-less fixing structure can be sold as an optional device and is easy to be promoted.

While the present invention has been shown and described with reference to a preferred embodiment thereof, and in terms of the illustrative drawings, it should not be considered as limited thereby. Various possible modifications, omissions, and alternations could be conceived of by one skilled in the art to the form and the content of any particular embodiment, without departing from the scope of the present invention. Accordingly, the above disclosure should be construed as limited only by the metes and bounds of the appended claims.

What is claimed is:

1. A screw-less fixing structure for fixing the add-on card of a PC, the PC comprises a back plate and a slot fixing module, the slot fixing module installed on the inner side of the PC has a plurality of fixing slots for assembling at least an add-on card,. the slot fixing module further comprises a fixing plane, the add-on card comprises a bracket with one end bent to form a fixing sheet, when assembling the add-on card, the fixing sheet attached to the fixing plane, the bracket is covered on the fixing slot of the add-on card; the screw-less fixing structure for fixing the add-on card comprising:

a support plate fixed on the back plate, having two pivot seats formed separately on two opposed edges;

a rotational pressing plate having two protrusion pivots and two arched bearings, the two protrusion pivots separately extend from two opposed edges of the rotational pressing plate and can pivot in the pivot seats of the support plate, and the two arched bearings'are formed by a first arched sheet and a second arched sheet;

a positioning device disposed on the inner side of the back plate; and a spring wire having a first hook pivot formed at one end and a second hook pivot formed at the other end, The first hook pivot is pivotally inserted into the first arched bearing, and the second hook pivot s pivotally inserted into the second arched bearing such that the spring wire is coupled to and can pivot with respect to the rotational pressing plate;

wherein the spring wire can be coupled to the positioning device, and the rotational pressing plate will press on the fixing sheet of the add-on card against the fixing plane so as to fasten the add-on card.

2. The screw-less fixing structure as claimed in claim 1, wherein the rotational pressing plate further comprises:

a grasping portion formed on one edge of the rotational pressing plate so that the grasping portion presses on the slot fixing module in a tightening state for fastening the add-on car.

3. The screw-less fixing structure as claimed in claim 2, wherein the rotational pressing plate is formed as a long strip plate.

4. The screw-less fixing structure as claimed in claim 2, wherein the grasping portion is formed as a strip.

5. The screw-less fixing structure as claimed in claim 2, wherein the grasping portion comprise a plurality of protrusions which are arranged to be spaced apart.

6. The screw-less fixing structure as claimed in claim 1, wherein the positioning device is formed as a projecting portion.

7. The screw-less fixing structure as claimed in claim 6, wherein the positioning device comprises:

a releasing end to be coupled with the spring wire for fastening the rotational pressing plate in the releasing state; and a tightening end to be coupled with the spring wire of fastening the rotational pressing plate in the tightening state.

8. The screw-less fixing, structure as claimed in claim 1, wherein the positioning device comprises:

a first pair of projecting studs to be coupled with the spring wire for fastening the rotational pressing plate in the releasing state; and a second pair of projecting studs to be coupled with the spring wire for fastening the rotational pressing plate in the tightening state.

9. The screw-less fixing structure as claimed in claim 1, wherein the support plate is fixed on the back plate by a plurality of screws.

10. The screw-less fixing structure as claimed in claim 1, wherein the back plate comprises a plurality of through holes; and the support plate comprises a plurality of inserting extrusions such that the support plate is fixed on the back plate by inserting the inserting extrusions to the corresponding through holes and by using the screws.

11. The screw-less fixing structure as claimed in claim 1, wherein the spring wire comprises a handling portion for a user to grasp.

12. The screw-less fixing structure as claimed in claim 1, wherein the spring wire is an elastic steel wire.

* * * * *